United States Patent
Miller et al.

(10) Patent No.: US 6,740,591 B1
(45) Date of Patent: May 25, 2004

(54) SLURRY AND METHOD FOR CHEMICAL MECHANICAL POLISHING OF COPPER

(75) Inventors: Anne E. Miller, Portland, OR (US); A. Daniel Feller, Portland, OR (US); Kenneth C. Cadien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 09/715,282

(22) Filed: Nov. 16, 2000

(51) Int. Cl.$^7$ .............................................. H01L 21/302
(52) U.S. Cl. ........................ 438/692; 438/693; 252/79.1
(58) Field of Search ................................ 438/690, 691, 438/692, 693; 252/79.1; 216/89

(56) References Cited

U.S. PATENT DOCUMENTS

| | | | | |
|---|---|---|---|---|
| 5,700,383 A | * | 12/1997 | Feller et al. ................... | 106/3 |
| 5,897,375 A | * | 4/1999 | Watts et al. ................... | 106/11 |
| 6,077,337 A | * | 6/2000 | Lee ............................... | 106/3 |
| 6,147,002 A | * | 11/2000 | Kneer ............................ | 134/3 |
| 6,214,098 B1 | * | 4/2001 | Lee ............................... | 106/3 |
| 6,346,144 B1 | * | 2/2002 | Lee ............................... | 106/3 |

FOREIGN PATENT DOCUMENTS

EP          0846742 A2      6/1998

OTHER PUBLICATIONS

International Search Report PCT/US 01/50030.

\* cited by examiner

*Primary Examiner*—Kin-Chan Chen
(74) *Attorney, Agent, or Firm*—Blakely, Sokoloff, Taylor & Zafman LLP

(57) ABSTRACT

A copper polish slurry, for chemical mechanical polishing of copper and copper diffusion barriers may be formed by combining a chelating, organic acid buffer system such as citric acid and potassium citrate; and an abrasive, such as for example colloidal silica. Alternative copper polish slurries, in accordance with the present invention, may be formed by further combining an oxidizer, such as hydrogen peroxide, and/or a corrosion inhibitor such as benzotriazole. Advantageous properties of slurries in accordance with the present invention include the enhancement of Cu removal rates to >3000 angstroms per minute. This high polish rate is achieved while maintaining local pH stability and substantially reducing global and local corrosion as compared to prior art copper polish slurries. Local pH stability provides for reduced within-wafer non-uniformity and reduced corrosion defects. Furthermore, copper diffusion barriers such as tantalum or tantalum nitride may also be polished with such slurries wherein the oxidizer is not included.

6 Claims, 3 Drawing Sheets

SLURRY AND METHOD FOR CHEMICAL MECHANICAL POLISHING OF COPPER

BACKGROUND OF THE INVENTION

1. Field of the Invention

The present invention relates generally to the field of chemical mechanical polishing (CMP), and more specifically, to methods and chemistries for providing increased metal polish rates.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology have lead to the integration of millions of transistors, each capable of switching at high speed. A consequence of incorporating so many fast switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect. Additionally, because the capacitance between two electrical nodes is a function of the overlap area between those nodes, using a smaller by copper interconnect line results In a decrease in parasitic capacitance. In this way, replacing aluminum based interconnects with copper based interconnects provides, depending on the dimensions chosen, reduced resistance, reduced capacitance, or both.

As noted above, copper has electrical advantages, such as lower resistance per cross-sectional area, the ability to provide for reduced parasitic capacitance, and greater immunity to electromigration. For all these reasons, manufacturers of integrated circuits find it desirable to include copper in their products.

While advantageous electrically, copper is difficult to integrate into the process of making integrated circuits. As is known in this field, copper can adversely affect the performance of metal oxide semiconductor (MOS) field effect transistors (FETs) if the copper is allowed to migrate, or diffuse, into the transistor areas of an integrated circuit. Therefore copper diffusion barriers must be used to isolate copper metal from those transistor areas. Additionally, unlike aluminum based metal interconnect systems which are formed by subtractive etch processes, copper interconnects are typically formed by damascene metal processes. Such processes are also sometimes referred to as inlaid metal processes. In a damascene process, trenches are formed in a first layer, and a metal layer is formed over the first layer including the trenches. Excess metal is then polished off, leaving individual interconnect lines in the trenches. The removal of excess copper is typically accomplished by chemical mechanical polishing. Although there are many known variations of the damascene method of metallization, the most common method for removing the excess copper is by CMP.

Accordingly, there is a need for CMP methods, materials, and apparatus to polish conductive materials such as copper.

DETAILED DESCRIPTION

Figure 1:
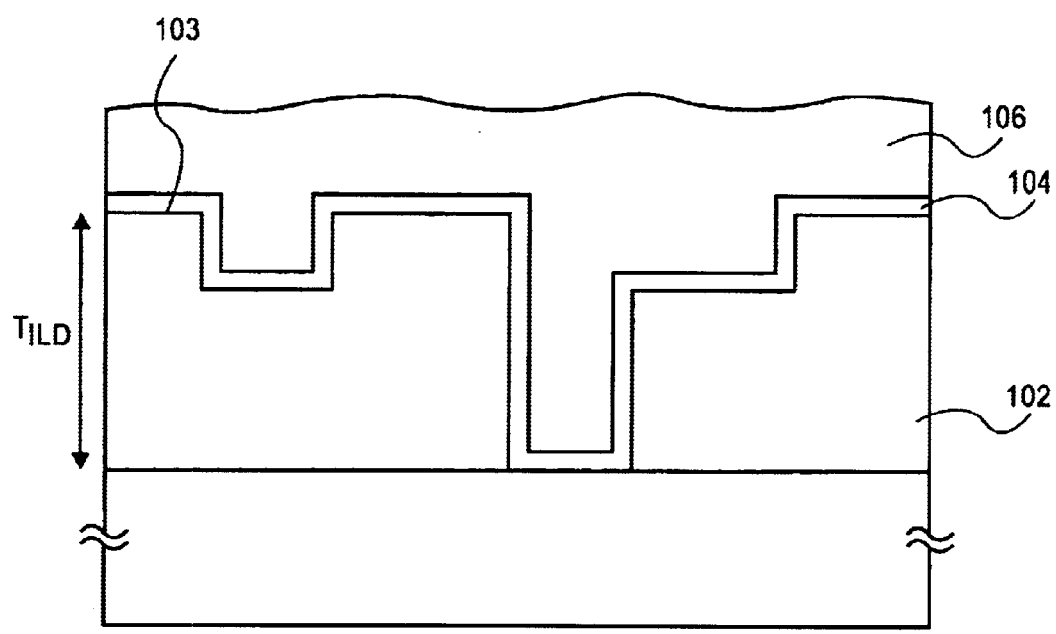
FIG. 1 is a schematic cross-sectional view of a copper damascene structure. This structure represents a post-plating, pre-polishing state of fabrication.

Methods and slurries for the chemical-mechanical polishing of copper are described. In the following description numerous specific details are set forth to provide an understanding of the present invention. It will be apparent, however, to those skilled in the art and having the benefit of this disclosure, that the present invention may be practiced with apparatus and processes that vary from those of the illustrative examples provided herein.

Terminology

The terms, chip, integrated circuit, monolithic device, semiconductor device or component, microelectronic device or component, and similar terms and expressions, are often used interchangeably in this field. The present invention is applicable to all the above as they are generally understood in the field.

RPM (also rpm) refers to revolutions per minute.

Reference herein to "one embodiment", "an embodiment", or similar formulations, means that a particular feature, structure, or characteristic described in connection with the embodiment is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Overview

Polishing of copper metal layers in connection with the formation of conductive interconnect lines for integrated circuits is becoming more important for the semiconductor industry. Unlike aluminum metallization, which is typically formed on integrated circuits by subtractive metal etch, copper interconnect lines are typically formed by way of a damascene, or inlaid, metal process. Such a process requires the removal, typically by chemical mechanical polishing, of the excess copper.

Several prior art slurries for chemical mechanical polishing of copper have had problems associated with them. For example, one such prior art slurry, based on a hard abrasive such as $Al_2O_3$, tended to cause excessive scratching and had an unpleasant odor. In another prior art example, a copper polish slurry contained propianic acid and a silica abrasive but had unsatisfactory characteristics with respect to corrosion, scratching, and odor.

An exemplary copper polish slurry, in accordance with the present invention, may be formed by combining a chelating, organic acid buffer system such as citric acid and potassium citrate; and an abrasive, such as for example colloidal silica and an oxidizer, such as hydrogen peroxide ($H_2O_3$). Alternative copper polish slurries, in accordance with the present invention, may be formed by further combining a corrosion inhibitor such as benzotriazole (BTA).

Advantageous properties of slurries in accordance with the present invention include the enhancement of Cu removal rates to >3000 angstroms per minute. Additionally, this high polish rate is achieved while maintaining local pH stability and substantially reducing global and local corrosion as compared to prior art copper polish slurries. Those skilled in the art will appreciate that local pH stability provides for reduced within-wafer non-uniformity and reduced corrosion defects.

The Slurry

Slurries, in accordance with the present invention, include a buffer system to increase the polish rate of a metal CMP system. These slurries are formed by combining a chelating organic acid buffer system such as citric acid and potassium citrate, with an abrasive such as colloidal silica. If the metal to be polished is copper or a copper alloy, then an oxidizer such as hydrogen peroxide should be combined with the slurry mixture. It will be appreciated by those skilled in the art that combining such ingredients may be done in any appropriate container, and may include mixing. Furthermore these ingredients may be combined outside of a container, such as, for example on a polishing pad. Alternative inventive slurries may be formed by further combining the above with a corrosion Inhibitor such as benzotriazole. Such slurries are particularly useful for polishing copper, and copper diffusion barriers.

An exemplary slurry, in accordance with the present invention, for chemical mechanical polishing, has a pH of approximately 3.8, and includes a $SiO_2$ abrasive, a $H_2O_2$ oxidizer, a benzotriazole corrosion inhibitor, and a citric acid/potassium citrate buffer system. These ingredients are combined, typically with water, to form the slurry. Those skilled in the art will appreciate that the slurry is a mixture of these ingredients, that various chemical reactions may occur amongst the ingredients, and that the slurry may contain various mixture and reaction products of the ingredients, including, but not limited to, complexes and disassociated ionic species. In other words, the slurry that results from combining, or mixing the ingredients, will contain at equilibrium, or at such other conditions as it may be subjected to, chemical constituents that arise by virtue of the combination of the ingredients in accordance with the present invention. It is noted that slurries in accordance with the present invention may have a pH in the range of 3 to 6.

In one particular illustrative slurry, the citric acid/potassium citrate buffer system is provided by including in the slurry mixture approximately 3 g/l of citric acid and approximately 3 g/l of potassium citrate.

An abrasive suitable for use in the embodiments of the present invention is a precipitated $SiO_2$. Precipitated $SiO_2$ is sometimes referred to in this industry as colloidal, although this term, i.e., colloidal, is not a technically accurate designation for this material. The illustrative slurry may contain 5 wt. % silica such as Klebesol 1498-50 (available from Rodel, Inc., 3804 East Watkins Street, Phoenix, Ariz. 85034).

The illustrative slurry may further be formed from combining hydrogen peroxide with the slurry mixture such that this oxidizer comprises 3 wt. %. Benzotriazole may be combined with the slurry mixture as the corrosion inhibitor. In the illustrative embodiment, the slurry mixture includes 0.015M benzotriazole.

Method

In an embodiment of the present Invention, a copper damascene structure is polished to form individual interconnects. FIG. 1 shows a copper damascene structure prior to the removal of the excess copper and copper diffusion barrier layer. An interlayer dielectric (ILD) layer is patterned to form ILD 102 on a surface of a wafer as illustrated in the figure. ILD 102 has a thickness represented by $T_{ILD}$ in FIG. 1. A copper diffusion barrier 104 is formed over the exposed surfaces of the wafer and ILD 102. Various materials may be used as the copper diffusion barrier. Tantalum and tantalum nitride may each be used as copper diffusion barriers. Typically, a copper seed layer is then formed on copper diffusion barrier 104. A complete copper layer 106 is then formed, typically by plating, over diffusion barrier 104. That portion of the copper that is above the top surface 103 of ILD 102 is considered to be excess. It can be seen by inspection of FIG. 1 that removal of the excess copper will result in the formation of two separate conductive interconnect structures.

Figure 2:
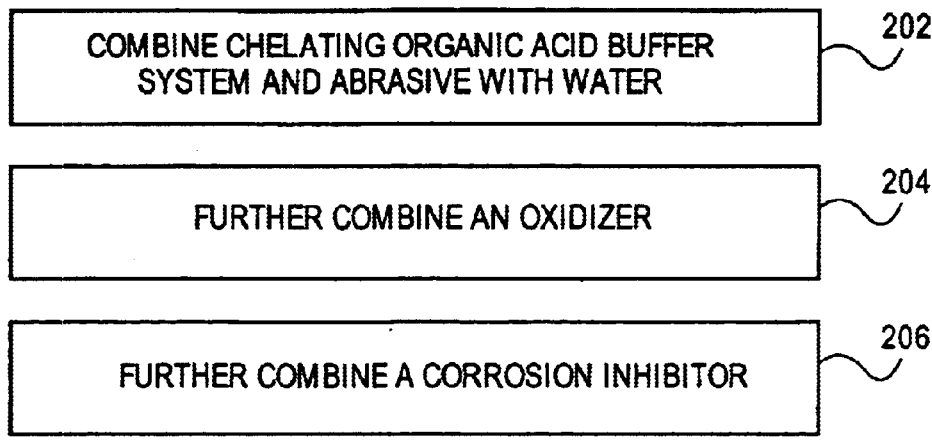
FIG. 2 is a flowchart showing the operations In a process of forming a slurry in accordance with the present invention

An embodiment of the process of forming a slurry in accordance with the present invention is illustrated in the flow diagram of FIG. 2.

As shown in block 202 of FIG. 2, a chelating organic acid buffer system and an abrasive are combined with water. In one embodiment the chelating organic acid buffer system is citric acid and potassium citrate, and the abrasive is colloidal silica. In block 204 an oxidizer is combined with the previously described mixture. In one embodiment the oxidizer is a low electrochemical potential oxidizer such as hydrogen peroxide. In block 206 a corrosion inhibitor is combined with the other ingredients identified above. It will be understood by those skilled in the art that specific order of introducing the ingredients to the slurry mixture may be changed consistent with the present invention. The present invention is not limited in terms of the order of combining ingredients. For example, water and benzotriazole may be combined, then the chelating buffer added, followed by an abrasive, and an oxidizer.

Figure 3:
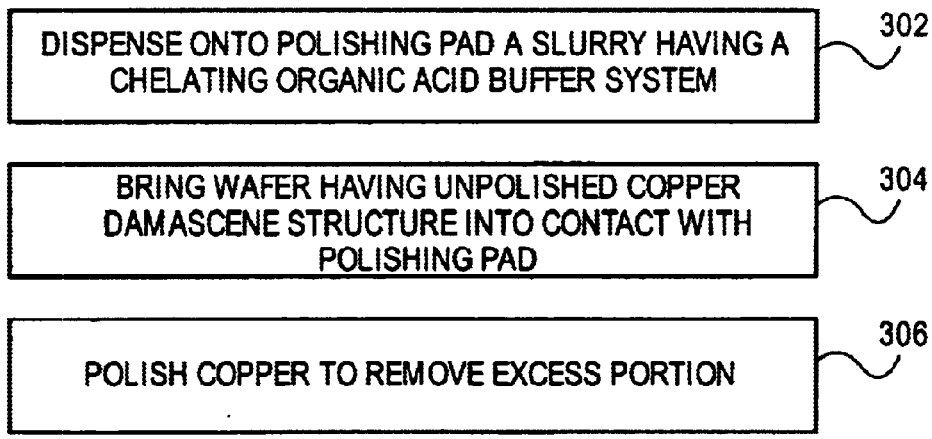
FIG. 3 is a flowchart showing the operations in a process of polishing a thin film in accordance with the present invention.

An embodiment of the method of polishing a thin film on a wafer, in accordance with the present invention, is described in conjunction with FIG. 3.

As is well known, in a typical CMP system, a wafer is placed face down on a rotating table covered with a polishing pad, which has been coated with a slurry. A carrier, which may be attached to a rotatable shaft, is used to apply a downward force against the backside of the wafer. A retaining ring may be used to center the wafer onto the carrier and to prevent the wafer from slipping laterally. By applying the downward force, and rotating the wafer, while simultaneously rotating a pad having slurry thereon, a desired amount of material may be removed from the surface of a thin film.

FIG. 3 shows a flow diagram of a process embodying the present invention. At block 302, a slurry, having a chelating organic acid buffer system in accordance with the present invention, is prepared, delivered to, and dispensed onto, a polishing pad. The slurry, as described above, may have a pH of approximately 3.8. Then, as shown at block 304, a wafer with a copper damascene structure formed thereon, is brought into contact with the fly polishing pad. As shown at block 306 the copper damascene structure is polished. Typical polishing conditions using an orbital polisher (e.g., IPEC 576 Orbital Polisher from Speed-Fam IPEC, 305 North 54$^{th}$ Street, Chandler, Ariz. 85226) are a down force of approximately 3.75 psi, a spindle speed of approximately 310 rpm, a wafer rotational speed of approximately 19 rpm, a slurry flow rate of approximately 130 ccm, and a delta P of 0.0 psi. Delta P is the pressure difference exerted on the top and bottom of the wafer and allows fine control of the rate at the edge of the wafer. Stacked polishing pads such as the IC1000, with a Suba-4 sub-pad, both made by Rodel, Inc. of 3804 East Watkins Street, Phoenix, Ariz. 85034, may be used with the slurry to polish copper films. Other commercially available polishing pads may be used with the present invention, for example FX-9 pads available from Freudenberg of Lowell, Mass.

Copper diffusion barriers, such as, for example, tantalum or tantalum nitride, are also successfully polished with slurries and polishing conditions in accordance with the present invention. In particular, by leaving out the oxidizer but including the chelating organic acid buffer system tantalum based copper diffusion barriers can be effectively polished.

Figure 4:
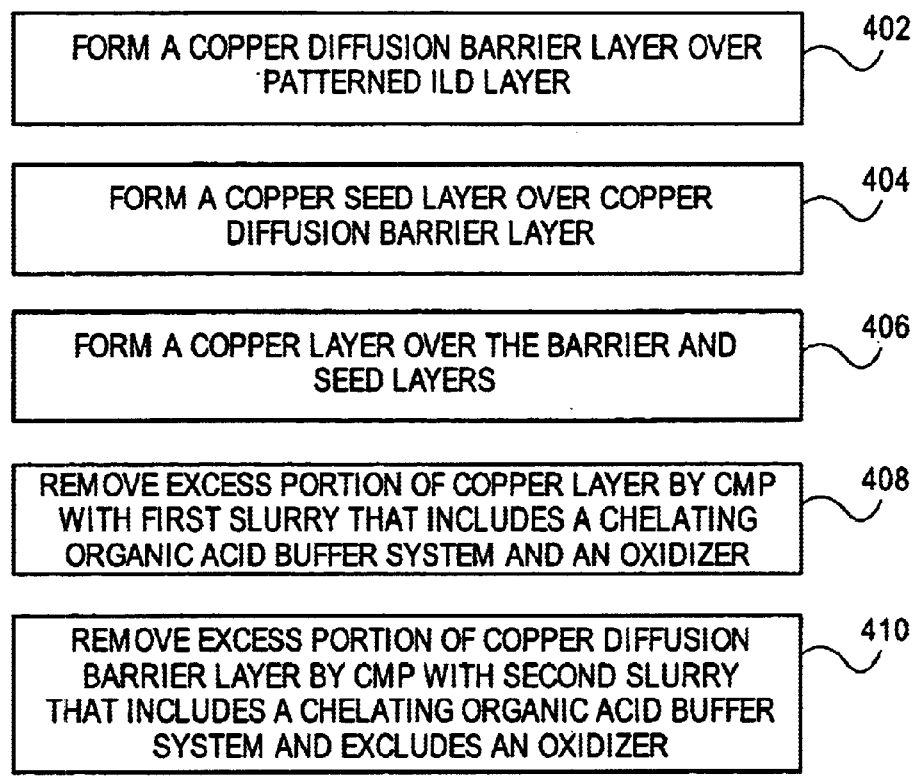
FIG. 4 is a flowchart showing the operations in a process of polishing a thin film in accordance with the present invention.

A method of forming copper interconnect in accordance with the present invention is described in conjunction with FIG. 4. Referring to FIG. 4, a illustrative method includes forming a copper diffusion barrier layer over a patterned ILD layer (402). This ILD layer, patterned so as to have trenches and vias therein, may be produced with any of the conventional methods of forming an ILD for damascene metal processing. ILD layers may include any suitable dielectric material, including but not limited to, silicon oxide, fluorine-dope silicon oxide, carbon-doped silicon oxide, and ILD layers based on materials other than oxides of silicon, such as, but not limited to organic polymers and porous inorganic materials. In the illustrative embodiment of the present invention a tantalum-based copper diffusion barrier is used. Such a barrier layer may be made of tantalum or tantalum nitride. A copper seed layer is then formed over the copper diffusion barrier layer (404). Subsequently, a copper layer is electroplated over the seed layer (406). The excess portion of the copper layer (as described above with reference to FIG. 1) is then removed by chemical mechanical polishing (408) with a slurry that includes a chelating organic acid buffer system and a low electrochemical potential oxidizer. Such a slurry may contain a citric acid/potassium citrate chelating organic acid buffer system, along with hydrogen peroxide as the oxidizer. An abrasive such as silica is also included in the slurry. A corrosion inhibitor such as benzotriazole may also be Included in the slurry. As the copper layer is removed the underlying diffusion barrier layer becomes exposed. The excess portion of the barrier layer, i.e., that portion over the top surface of the ILD, is then removed (410). The slurry chemistry is modified such that the oxidizer is left out for removing the excess portion of the diffusion barrier layer. In other words, a first slurry formulation is used when beginning to polish the copper layer, but a second slurry formulation, similar to the first except for the presence of the oxidizer, is then dispensed to polish the underlying tantalum-based diffusion barrier layer.

With respect to the illustrative embodiment of FIG. 4, copper polishing and barrier layer polishing may be performed on the same pad or on different pads. In the either scenario, copper is polished until a predetermined end point is reached, either by timing the polish, by detecting a change in CMP motor current, or by any other suitable method. If both layers are to be polished on the same pad, the slurry chemistry is modified either by dispensing a second slurry without the oxidizer, or by simply turning off the oxidizer dispenser if this was being delivered directly to the polishing pad. If each layer is to be polished on separate pads, then when the desired endpoint is detected, the wafer may be moved to a second pad to which the second slurry is delivered.

Conclusion

Embodiments of the present invention provide a slurry suitable for chemical mechanical polishing of metals, such as, for example, copper. Other embodiments of the present Invention provide methods for forming conductive interconnect lines in an integrated circuit.

An advantage of some embodiments of the present invention is that the chelating agent enhances the copper removal rate to greater than 3000 angstroms per minute while using a low electrochemical potential oxidizer such as hydrogen peroxide. Compatibility with low electrochemical potential oxidizers reduces the driving force for pitting and other forms of localized corrosion.

A further advantage of some embodiments of the present invention is that in the presence of a citric acid buffer system, the concentration of benzotriazole can be significanty increased to control the static etch rate (sometimes referred to global corrosion) without shutting down the polish rate.

A still further advantage of some embodiments of the present invention is that the chelating, organic acid buffer enhances the removal rate in the presence of a soft abrasive such as colloidal $SiO_2$.

A still further advantage of some embodiments of the present invention is that the buffer system substantially ensures local pH uniformity which, in turn, decreases within-wafer non-uniformity, and also reduces local corrosion.

A still further advantage of some embodiments of the present invention is that the chelating agent enhances the removal rate over a wide pH range and can be used at high pH with a high pH buffer system.

A still further advantage of some embodiments of the present invention is that the chelating, organic acid buffer system, as opposed to conventional slurries, has no substantial stability, odor, health, or disposal issues associated therewith.

A still further advantage of some embodiments of the present invention is that the ingredients of the slurry form a cost-effective product.

A still further advantage of some embodiments of the present invention is that an effective slurry for polishing Ta and TaN (i.e., copper diffusion barriers), can be formed by combining the chelating, organic acid buffer system with an abrasive and a corrosion inhibitor, i.e. the oxidizer component need not be added to the slurry.

It will be apparent to those skilled in the art that a number of variations or modifications may be made to the illustrative embodiments described above. For example, various combinations, slurry pH, slurry delivery rate, pad rotation speed, pad temperature, and so on, may be used within the scope of the present invention.

Other modifications from the specifically described apparatus, slurry, and process will be apparent to those skilled in the art and having the benefit of this disclosure. Accordingly, it is intended that all such modifications and alterations be considered as within the spirit and scope of the invention as defined by the subjoined Claims.

What is claimed is:

1. A method of forming copper interconnect, comprising:

forming a barrier layer over a substrate having at least one trench therein;

forming a copper seed layer on the surface of the barrier layer;

forming a copper layer over the barrier and seed layers;

removing a portion of the copper layer by chemical mechanical polishing with a first slurry comprising a chelating organic acid buffer system, colloidal silica, and a low electrochemical oxidizer; and removing at least a portion of the barrier layer by chemical mechanical polishing with a second slurry comprising a chelating organic acid buffer system, and colloidal silica;

wherein the second slurry is formed without the oxidizer.

2. The method of claim 1, wherein the barrier layer comprises tantalum.

3. The method of claim 2, wherein the chelating organic acid buffer system comprises citric acid and potassium citrate.

4. The method of claim 3, wherein the oxidizer comprises hydrogen peroxide.

5. The method of claim 4, wherein the first slurry further comprises a corrosion inhibitor.

6. The method of claim 5, wherein the first slurry has a pH in the range of 3 to 6, and the corrosion inhibitor comprises benzotriazole.

* * * * *

UNITED STATES PATENT AND TRADEMARK OFFICE
CERTIFICATE OF CORRECTION

PATENT NO. : 6,740,591 B1
DATED : May 25, 2004
INVENTOR(S) : Miller et al.

It is certified that error appears in the above-identified patent and that said Letters Patent is hereby corrected as shown below:

Column 1,
Line 48, delete "by".

Column 3,
Line 15, delete "$H_2O_3$" and insert -- $H_2O_2$ --.

Column 5,
Line 10, delete "fly".

Column 7,
Line 12, after "forming", insert -- a --.

Signed and Sealed this

Eighth Day of February, 2005

JON W. DUDAS
*Director of the United States Patent and Trademark Office*